United States Patent [19]

Weisbloom

[11] Patent Number: 5,059,925
[45] Date of Patent: Oct. 22, 1991

[54] METHOD AND APPARATUS FOR TRANSPARENTLY SWITCHING CLOCK SOURCES

[75] Inventor: John D. Weisbloom, Los Gatos, Calif.

[73] Assignee: Stratacom, Inc., Campbell, Calif.

[21] Appl. No.: 590,668

[22] Filed: Sep. 28, 1990

[51] Int. Cl.$^5$ ............................................. H03L 7/00
[52] U.S. Cl. ..................................... 331/1 A; 331/25
[58] Field of Search ..................... 331/1 A, 16, 18, 25; 328/133, 134, 155

[56] References Cited

U.S. PATENT DOCUMENTS

| | | | |
|---|---|---|---|
| 4,668,922 | 5/1987 | Crawford et al. | 331/1 A |
| 4,754,235 | 6/1988 | Fujiwara | 331/1 A |
| 4,812,783 | 3/1989 | Honjo et al. | 331/25 X |
| 4,893,094 | 1/1990 | Herold et al. | 331/25 X |

OTHER PUBLICATIONS

"PCM Jitter Attenuator", Crystal Semiconductor Corporation Data Book, vol. 2, pp. 5-3 through 5-14 and 11-31 through 11-32 (Apr. 1990).

Primary Examiner—Robert J. Pascal
Attorney, Agent, or Firm—Blakely, Sokoloff, Taylor, & Zafman

[57] ABSTRACT

A method and apparatus for stably maintaining an output clock signal from a phase-locked loop (PLL) frequency multiplier when switching from one clock source to another clock source is described. This method and apparatus maintains the phase relationship between the external signal to the phase detector and the feedback signal from the divider to the phase detector.

10 Claims, 7 Drawing Sheets

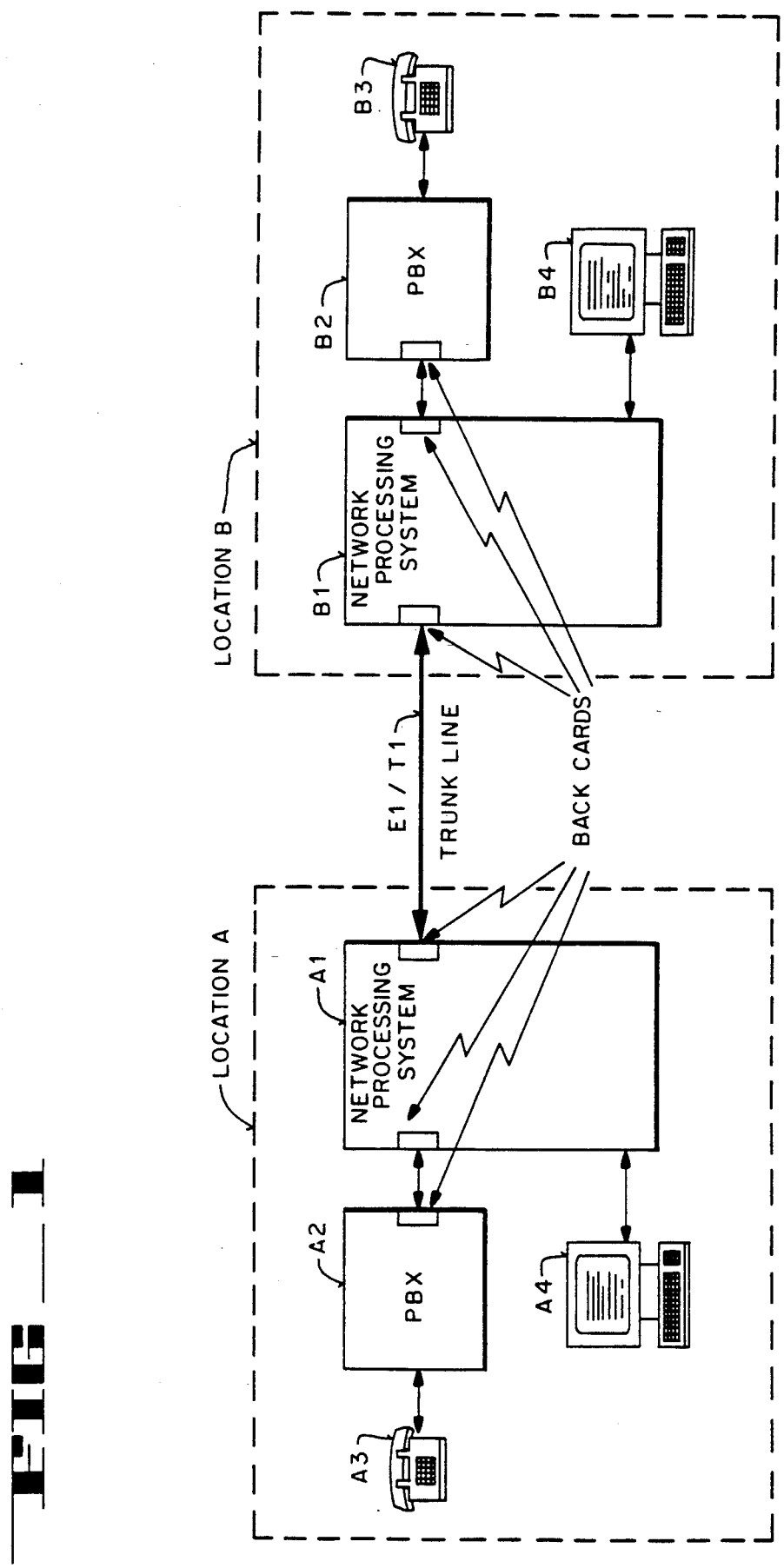
FIG—1

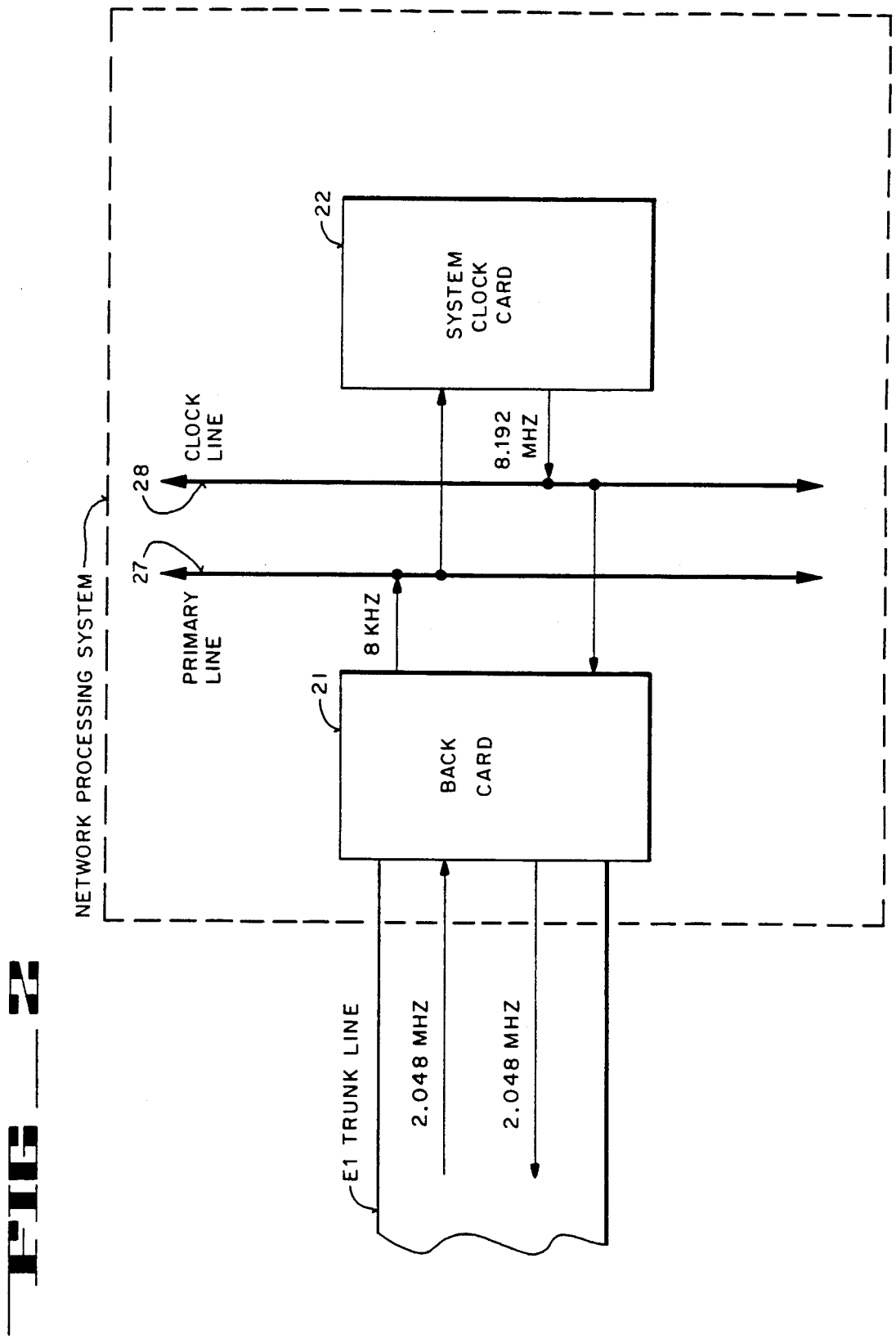

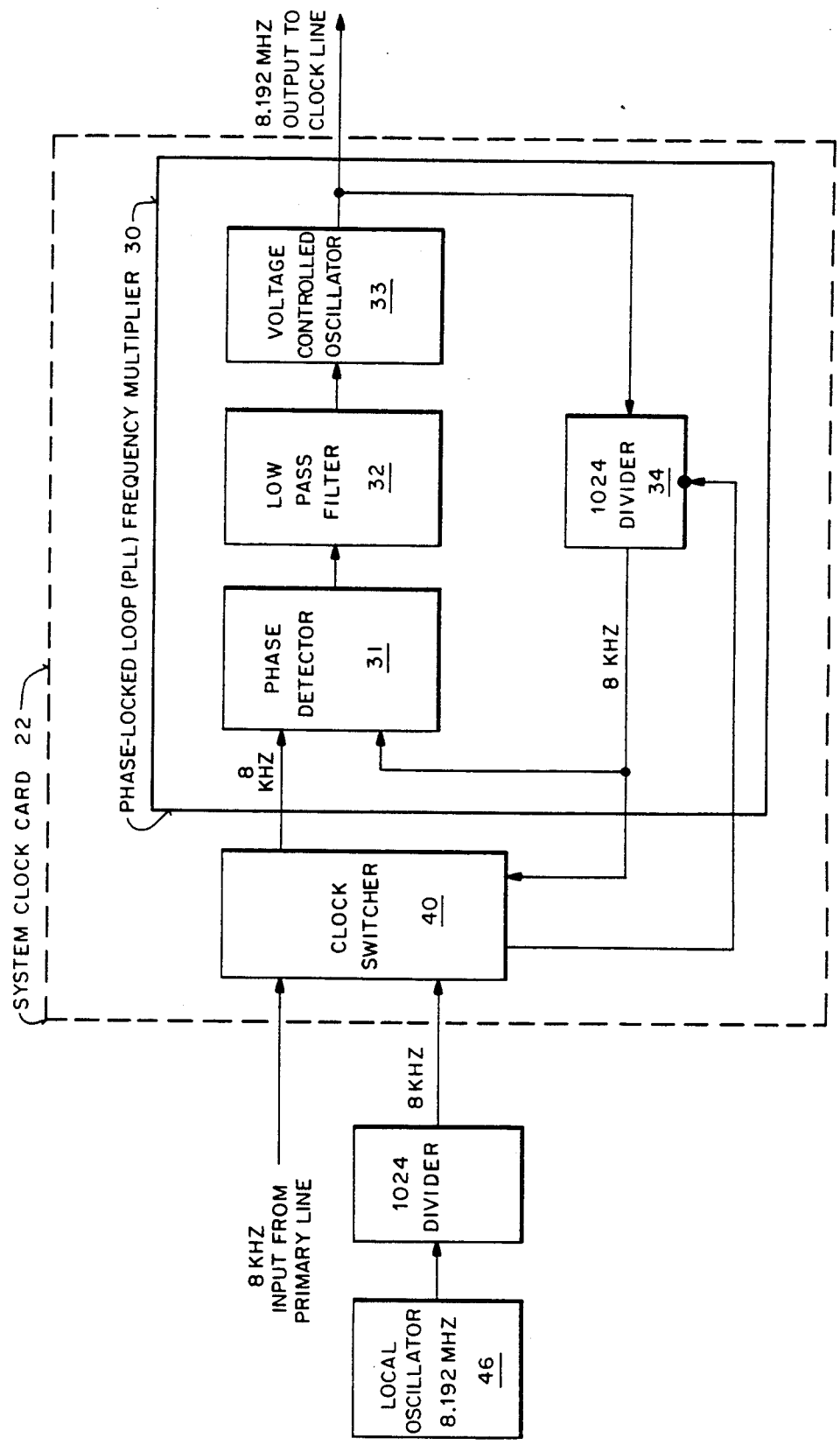

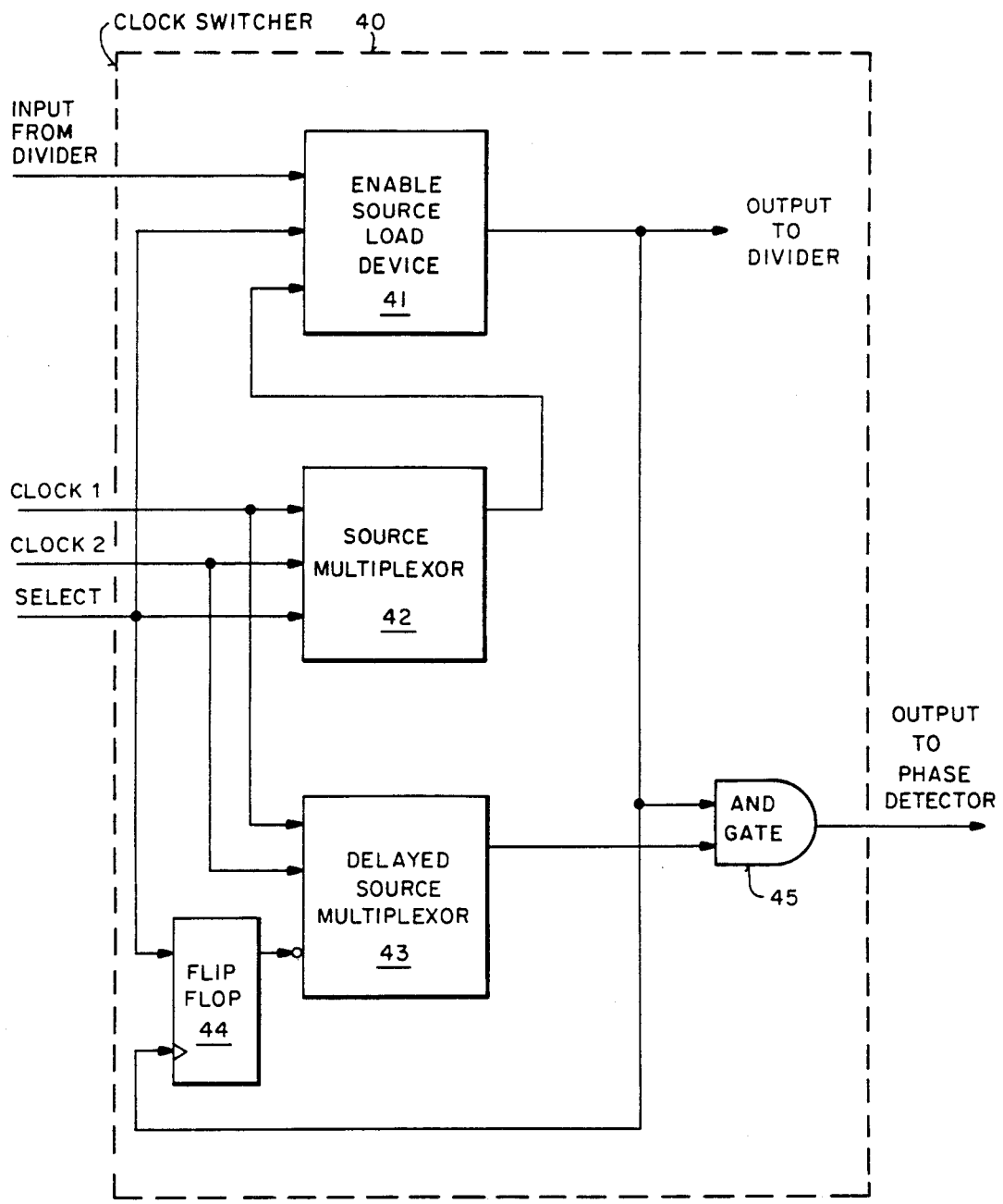

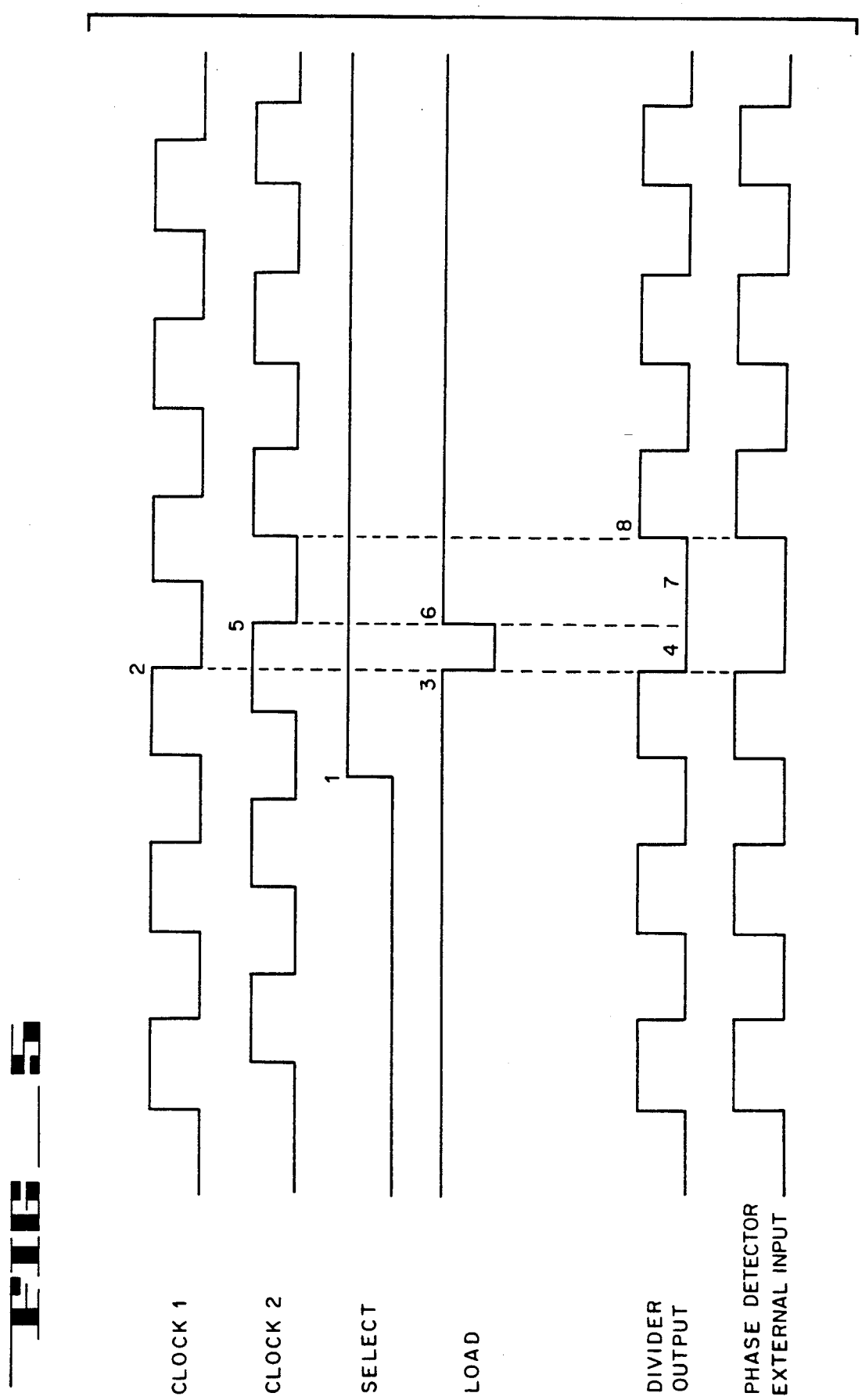
FIG_5

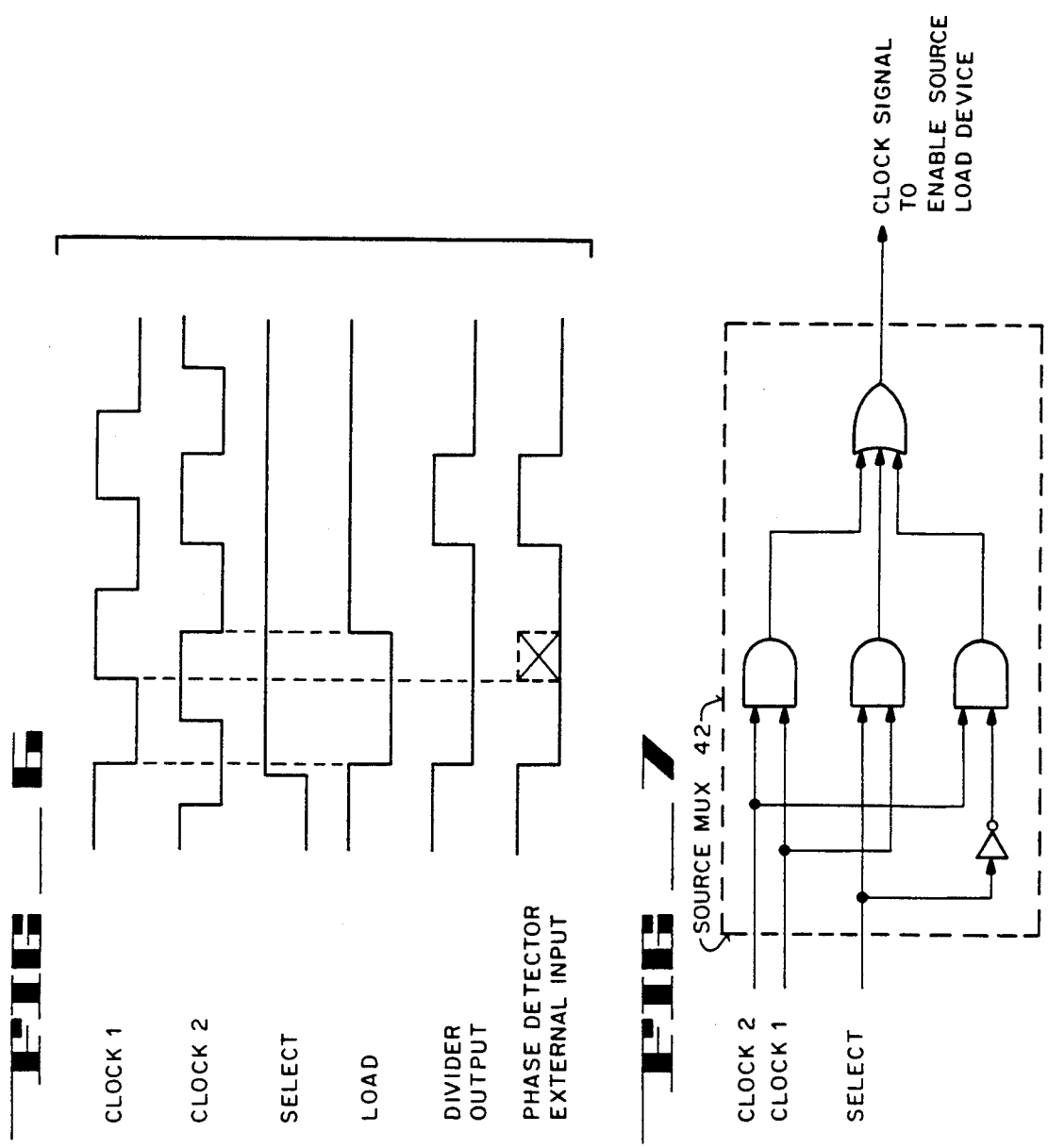

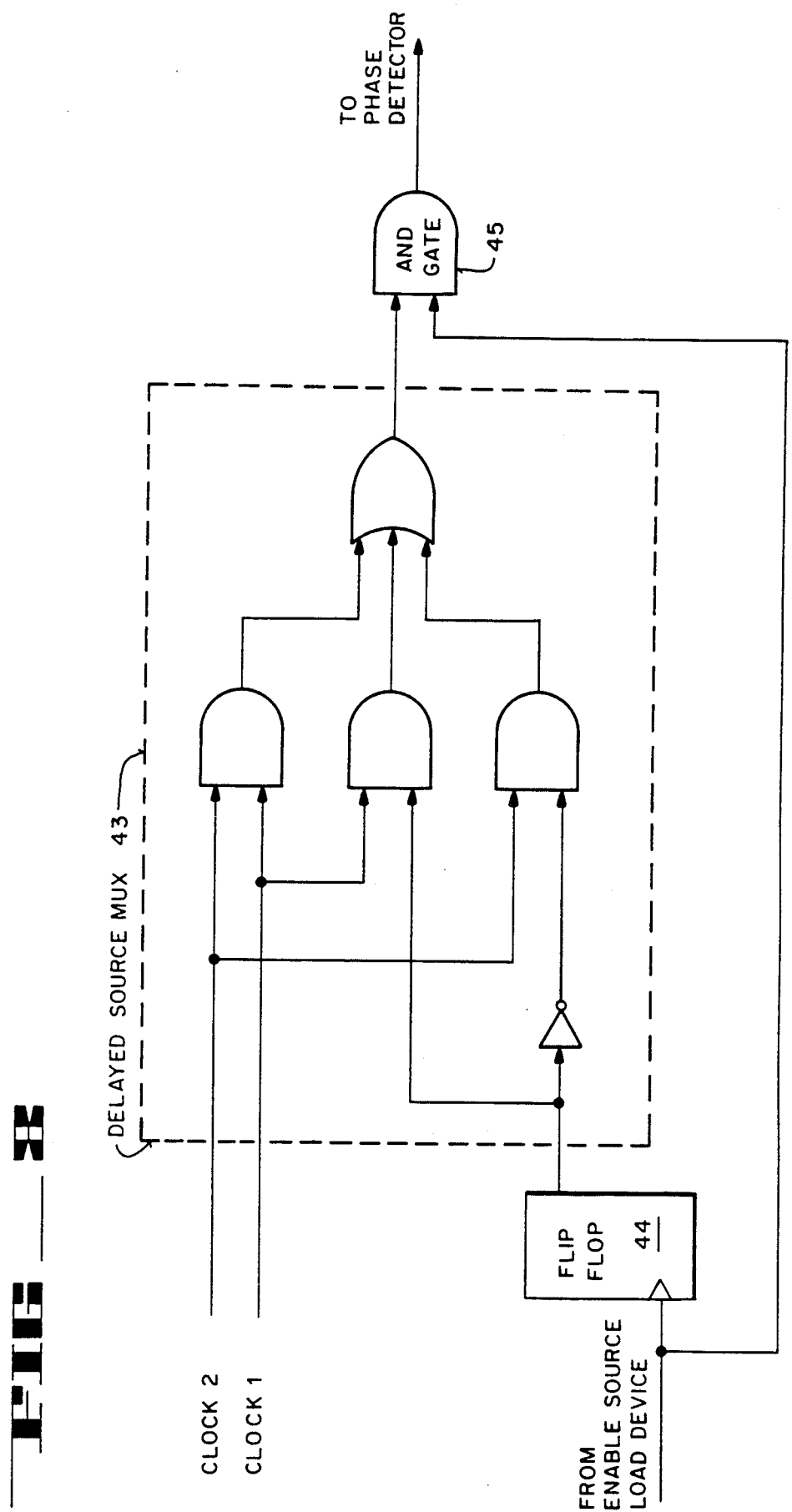

METHOD AND APPARATUS FOR TRANSPARENTLY SWITCHING CLOCK SOURCES

FIELD OF THE INVENTION

The present invention relates to the field of generating a stable clock source. More particularly, this invention relates to stably switching clock inputs to phase-locked loop (PLL) frequency multipliers used to generate a stable clock source.

BACKGROUND OF THE INVENTION

Maintaining a stable clock signal is often one of the fundamental requirements in modern electronics due to the need for synchronous timing of switching circuits, memory devices and data transmission. Phase-locked loops (PLL's) are commonly used to generate clock signals due to their ability to generate a clean stable output from a noisy input. Further, PLL frequency multipliers are commonly used to generate a clock signal locked to a reference frequency already available. For example, generation of a 61.440 kHz clock signal locked to a 60 Hz power line already present in the circuitry can be obtained by using a PLL frequency multiplier with a 1024 divider (61,440 Hz=60 Hz×1024).

Many circuits, for example telecommunications networks, must be able to switch from one clock source to another. This can occur when the first clock source is deteriorating or is going away, or when another clock source is desired for some reason. Unfortunately, switching from one clock source to another typically can cause numerous faults in the circuit being clocked if the switch is not smooth enough to be essentially 'seamless' or transparent to the clocked circuit. Further, when using a phase-locked loop frequency multiplier to generate a clock signal, merely switching inputs to the PLL frequency multiplier typically can cause large variations in the output clock signal. These variations are due to the phase detector in the PLL frequency multiplier seeing large phase differences between its two inputs (one the new clock signal, the other the feedback signal from the divider). This results in a new voltage signal being sent to the voltage controlled oscillator, which causes the oscillator to output a clock signal at variance with the old clock signal. These varying clock signals typically continue until the PLL frequency multiplier has stabilized to the new input clock signal. In the meantime, the circuitry relying on the clock signal from the PLL may have incurred timing faults due to the varying clock signals output to it.

The problem thus faced is how to switch from one clock signal to another clock signal input to a PLL frequency multiplier without causing large variations in the output clock signal fed to the circuitry relying on the clock signals. One prior approach is to clamp down on or limit how much the voltage range to the voltage controlled oscillator can vary. Although this does temper variations in the output clock signal, this is really only a partial solution because this still does not prevent the clocked circuitry from incurring errors. This is because the output clock signal can still vary to an unwanted degree.

Another prior approach to maintaining a stable output clock signal when switching from one clock source to another clock source input to a PLL frequency multiplier is to increase the dampening factor of the low pass filter while making the switch, thus preventing short swings in the phase detector output from being passed on to the voltage controlled oscillator. Unfortunately, this is a cumbersome solution because it is too dependent upon matching the device characteristics of the particular low pass filter used in a given PLL frequency multiplier.

Still another prior approach is to wait out the two clock signals. Since two signals, if there is at least a slight variation in their relative frequencies, will eventually both be either high or low at the same time, a switch could be made in that instant. The problem with this solution is that one could wait a very long time for the two signals to match which is not very feasible in a working environment and is thus also an inadequate solution.

SUMMARY AND OBJECTS OF THE INVENTION

One objective of the present invention is to provide an improved apparatus for maintaining a stable output clock signal from a PLL frequency multiplier when switching from one clock signal to another clock signal.

Another objective of the present invention is to provide an improved method of maintaining a stable output clock signal from a PLL frequency multiplier when switching from one clock signal to another clock signal.

Another objective of the present invention is to provide an improved apparatus for maintaining a stable output clock signal from a PLL frequency multiplier when switching from one input clock signal to another input clock signal such that the clocked circuitry relying on the stable output clock signal from the PLL frequency multiplier will not incur timing errors caused by the switch from the one input clock signal to the other input clock signal.

Another objective of the present invention is to provide an improved method of maintaining a stable output clock signal from a PLL frequency multiplier when switching from one input clock signal to another input clock signal such that the clocked circuitry relying on the stable output clock signal from the PLL frequency multiplier will not incur timing errors caused by the switch from the one input clock signal to the other input clock signal.

These and other objects of the present invention are provided for by an apparatus for maintaining a stable output from a phase-locked loop frequency multiplier when switching the input to said PLL frequency multiplier from a first clock signal to a second clock signal. When the second signal is selected, a load circuit receives the output of the divider of the PLL frequency multiplier and changes its output load signal from a first type of state to a second type of state when the output of the divider changes from a first type of state to a second type of state. The output of the load circuit is input to the divider of the PLL frequency divider and clears the divider when the load signal is in a second type of state. A switch, receiving both the first clock signal and the second clock signal, outputs the second clock signal when it is selected. The load circuit receives the second clock signal output from the switch when the second clock signal is selected and changes the output load signal back to a first type of state when the second clock signal changes from a first type of state to a second type of state. The load signal, having returned to a first type of state, allows the divider of the PLL frequency multiplier to resume counting hence aligning the divider with the second clock signal. Another switch, also receiving both the first clock signal and the second clock signal, additionally receives the output load signal from the load circuit and switches its output from the first clock signal to the second clock when the second clock signal is selected and the load signal has returned to its first type of state. A logic circuit performs a logical AND on the second clock signal output from the second switch and the load signal and outputs the result as an input to the PLL frequency multiplier.

These and other objects of the present invention are also provided for by a method of maintaining a stable output from a phase-locked loop frequency multiplier when switching the input from a first clock signal to a input clock signal. The divider of the PLL frequency multiplier is cleared when the first clock signal changes from a first type of state to a second type of state. The feedback signal within the PLL frequency multiplier is thus held in a second type of state. The divider is allowed to resume counting when the second clock signal changes from a first type of state to a second type of state hence aligning the divider with the second clock signal. The input to the PLL frequency multiplier is switched from the first clock signal to the second clock signal when the second clock signal is in a second type of state and before the divider of the PLL frequency multiplier has finished counting and has output a change in type of state.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which:

FIG. 1 depicts a typical network configuration;

FIG. 2 is a block diagram of the interface between the telephone trunk line and the back card within the network processing system and the back card's connection to the System Clock Card;

FIG. 3 is a schematic diagram of a phase-locked loop frequency multiplier with clock switching circuitry of the present invention attached;

FIG. 4 is a schematic diagram of the clock switching circuitry of the present invention;

FIG. 5 is a timing diagram of the various signals associated with switching from one clock source to another using the clock switching method and circuitry of the present invention;

FIG. 6 is another timing diagram of the various signals associated with switching from one clock source to another using the clock switching method and circuitry of the present invention.

FIG. 7 is a logic diagram of the source multiplexor contained within the clock switching circuitry of the present invention;

FIG. 8 is a logic diagram of the enable source multiplexor, flip-flop and AND gate contained within the clock switching circuitry of the present invention;

DETAILED DESCRIPTION

With reference to the drawings, FIG. 1 illustrates a preferred network configuration utilizing network processors A1 and B1. Each physical location wishing to communicate across the network can do so by connecting to the telephone trunk line designated E1/T1 in the drawing. This connection can be accomplished via a network processing system as shown in FIG. 1 where Location A is connected to the E1/T1 trunk line through network processing system A1 and Location B is connected to the E1/T1 trunk line through network processing system B1. Location A can then transmit/receive voice, data, video, as well as other signals, to/from Location B across the E1/T1 trunk line. Generation and reception of these various signals is accomplished at Location A by private branch exchange ("PBX") A2, telephone A3, computer A4, etc., and at Location B by private branch exchange ("PBX") B2, telephone B3, computer B4, etc.

Clocking in a network involves synchronizing the flow of data into and out of the network's nodes. A node receiving data must clock its incoming bit stream at the same rate as the node sending data. If the nodes have different clocks, they will eventually drift far enough out of synchronization to require a "frame slip" (mistransmission of data with associated resending required) in order to bring the nodes back into synchronization.

In one preferred embodiment, the network uses more than one clock source. Networks which use clocks from more than one carrier are called "plesiochronous" networks. They can be viewed as a set of subnetworks, each with its own clock. When these subnetworks become unsynchronized, frames are slipped at the trunks connecting them in order to compensate.

To maintain a synchronized network, in the preferred embodiment, the entire network is clocked from one clock source. This source can be an external source connected to the system clock card ("SCC") of the network processing system or it can be an oscillator contained on the SCC itself. In either case, this clock signal is then transmitted throughout the network to be the master clock signal for all the other nodes in the network. The network processing system can thus derive its clock source from an internal clock, a port, a trunk, or an external clock device. The SCC is thus a card contained within the network processing system which provides a centralized clock generation function for the network processing system, producing the system clock and the trunk synchronizing clocks, as well as an interface port for external clock sources.

FIG. 2 shows in more detail the interface between the E1 telephone trunk line, and the back card 21 and SCC 22 within the network processing system. The back card 21 receives a 2.048 MHz clock signal which is the European E1 trunk line standard and converts this to an 8 kHz signal. (Note that the North American trunk line standard, T1, is 1.544 MHz which is equally supported by the preferred embodiment of the present invention.) The back card 21 outputs this 8 kHz signal to the primary line 27. The SCC 22 picks up the 8 kHz signal from the primary line 27 and regenerates an 8.192 MHz signal from the Clock Line 28 which is then reconverted to a 2.048 MHz signal for communicating on the trunk line. This transmission, conversion and generation is what maintains consistent synchronous clocking throughout the system.

FIG. 3 shows a phase-locked loop (PLL) frequency multiplier circuit 30 contained within an SCC 22. The PLL frequency multiplier is used to generate a clock signal due to its ability to generate a clean stable multiple of an input or reference clock signal. Briefly reviewing the operation of the PLL frequency multiplier 30, the phase detector 31 generates an output signal based upon the phase difference between its two inputs, one from an external source and the other as a feedback signal. This phase difference output is passed through a low pass filter 32 which produces a voltage at its output. This voltage is passed on to the voltage controlled oscillator ("VCO") 33 which is an oscillator device that varies its output frequency based on a change in input voltage. The divider 34 is a counter circuit which divides the frequency signal from the VCO 33 and thus provides a divided feedback frequency signal to the phase detector 31. As the phase difference between the external signal and the feedback signal becomes smaller and smaller, so does the output from the phase detector thus causing the VCO output to vary less and less. Thus, the PLL eventually stabilizes such that the output from the VCO is a fixed multiple of the external input signal.

As network use has increased, so have the requirements for clean stable signals and stricter timing synchronization. Although timing variations of ±400 or 500 parts per million (PPM) were acceptable in the past, today timing signals must stay within ±50 PPM. For instance, with a timing signal standard of 8.192 MHz and an allowable variation of ±50 PPM, the actual clock signal must not vary from the 8.192 MHz standard by more than approximately 0.0004 MHz (400 Hz). If a timing signal is allowed to exceed this standard, one of two situations could occur. Either the equipment in the network (e.g., a PBX) may not be able to extract a clock signal at all, with a resulting loss of synchronization in the network, or if the PBX is able to extract a clock, it might still set off alarm signals because the clock signal is out of specification.

Under normal operating conditions, maintaining this clock signal standard is not a problem. However, when it is desired to switch from one clock source to another, for instance when a different reference clock signal is desired, maintaining clocking within the more rigid modern clock signal standards can be a problem.

Directly switching the input to the PLL from one clock source to another clock source (regardless of whether this is switching from one external clock to the other external clock or switching from one external clock to an internal oscillator clock source and then to the other external clock) would result in the phase detector 31 seeing a phase difference between the feedback signal, which is in phase with the first clock signal, and the new input clock signal. This phase difference would cause the phase detector to alter its output thus causing the VCO to vary its output frequency. This new output frequency, while still varying in its attempt to lock-on to the new input clock signal, could cause variations beyond the ±50 PPM allowed by the modern signal standard. Thus, merely doing a hard switch from one clock source to another clock source could cause alarm conditions throughout the system relying on this clock source.

The preferred embodiment of the present invention provides a method and an apparatus for stably maintaining the output clock signal from a PLL frequency multiplier when switching from one clock signal to another clock signal. This is accomplished by maintaining the phase relationship between the input signal to the phase detector and the feedback signal from the divider to the phase detector.

In operation, there are two switches which can occur. The first switch is from the external clock signal to an oscillator signal available to the SCC. The second switch is from the oscillator clock signal to the other external clock signal. However, switching from one external clock signal to another external clock signal could be accomplished with the preferred embodiment of the present invention if both external clock signals were separately fed to the clock switch circuit 40.

Again referring to FIG. 3, the clock switcher circuit 40 is shown as a front end to the PLL frequency multiplier 30. The clock switcher 40 receives the external clock signal and passes it on to the phase detector 31. The clock switcher 40 also receives a clock signal from local oscillator clock 46. The output of the divider 34 within the PLL frequency multiplier 30 is also input to the clock switcher 40 while the clock switcher 40 provides a load and clear signal line back to the divider 34.

FIG. 4 shows the internal circuitry and the external connections of the clock switcher 40. Clock switcher 40 is comprised of enable source load device 41, source multiplexor 42, delayed source multiplexor 43, flip-flop 44, and AND gate 45. Load device 41 is a synchronous state machine, clocked at 8.192 MHz, consisting of seven states and is embedded within a programmable logic array comprised of flip-flops and logic gates. In the preferred embodiment, load device 41 samples its inputs to determine if they are in a low state or a high state as opposed to reacting to a rising or falling edge. In an alternative embodiment of the present invention, the control provided by the load device 41 could be provided by standard TTL devices. The state machine used for the load device 41, embedded within the programmable logic array or comprised of TTL gates, follows from the methods described herein.

In operation, enable source load device 41 receives a select signal when it is desired to switch from one clock source to another. This select signal tells load device 41 to begin watching the output of divider 34 (note that the divider 34 output initially provides the same signal as the first input clock signal due to the function of PLL frequency multiplier 30). Load device 41, normally outputting a high load signal, drops the load signal to a low state upon seeing the divider 34 output signal go low (again, the same as the first input clock signal). This low load signal, connected to the divider 34, causes the divider 34 to continuously load and clear while the load signal remains low.

The source multiplexor 42, having also received the select signal, switches its output from the first clock signal to the second clock signal and outputs this to the enable source load device 41. The load device 41 then begins watching the second clock signal and raises the load signal back to a high state when the second clock signal goes low. This load signal, again in a high state, causes the divider 34 to continue counting in preparation to output its divided frequency signal.

Next, the flop-flop 44, having also received the select signal, also now sees the load signal return to its high state and thus outputs the select signal to the delayed source multiplexor 43. The delayed source mux 43 thus switches its output from the first clock signal to the second clock signal. This output signal, now carrying the second clock signal, is input to AND gate 45 and is logically ANDed with the load signal. Since the load signal has returned to its high state, the AND gate 45 now outputs the second clock signal which is input to the external line to the phase detector 31 of the PLL frequency multiplier 30. Thus, the PLL frequency multiplier 30 receives the second clock signal as its input signal rather than the first clock signal.

It is important to note that throughout the above sequence the phase detector 31 has seen little or no variation between its external input signal and its feedback signal from the divider 34. In the preferred embodiment of the present invention, either the phase detector 31 is reactive to the falling edges of its input signals or the clock signal maintains a 50% duty cycle. Note that with a 50% duty cycle clock signal, the preferred embodiment also supports the use of an exclusive-OR circuit for the phase detector 31 of the PLL frequency multiplier 30. If a phase detector reactive to the rising edges of its input signals is desired or if the clock signal does not maintain a 50% duty cycle, an alternative embodiment as described below should be used.

FIG. 5 shows a timing diagram which further explains how the above sequence and devices ensure that the phase detector 31 sees a consistent phase relationship between its two inputs, thus maintaining a stable output signal which thus causes the PLL frequency multiplier 30 to maintain a stable output frequency with little or no variation.

Reviewed from top to bottom, the first timing signal is the first clock signal and the second timing signal is the second clock signal. As can be seen, these signals are out of phase such that merely switching from one to the other as input to the PLL frequency multiplier 30 would cause the phase detector 31 to react to this phase difference and vary its output to the low pass filter 32 and the VCO 33 which would cause the output frequency to vary and thus cause timing faults in the system.

The third timing signal is the select signal line which indicates when a change from one clock signal to another clock signal is desired. The fourth timing signal is the load signal output from the load device 41 and input to both the divider 34 and the AND gate 45. The fifth timing signal is the output signal from the divider 34 and the sixth timing signal is the output signal from the VCO 33 which is the input signal to the phase detector 31.

Reviewing the sequence of events described above, when the select line signals a desired change in clock signal (reference 1 in the third line), the load device 41 watches the output signal from the divider 34 (which, at this point in time, is still the same signal as the first clock signal). Then, when the divider 34 output next goes low (reference 2 in the first line), the load device 41 drops the load signal to a low state (reference 3 in the fourth line). This low state load signal causes a load and clear of the divider 34 which keeps the divider output at a low state (reference 4 in the fifth line). Next, the load device waits until the second clock signal goes low (reference 5 in the second line), and then raises the load signal back to a high state (reference 6 in the fourth line).

Load device 41, by raising the load signal back to a high state, stops clearing the divider 34 (reference 7 in the fifth line). Divider 34 thus continues counting and will return to its periodic signal when it raises its output signal (reference 8 in the fifth line). This combination of holding the divider 34 output signal in a low state (reference 4 in the fifth line) and then releasing the divider 34 (reference 7 in the fifth line) synchronous with the second clock signal is what causes the divider 34 output to become aligned with the second clock signal. Since the input to the phase detector 31 is switched from the first clock signal to the second clock signal during this period, the phase detector 31 continues to see two input signals (an external clock signal and a feedback signal from the divider 34) which remain in phase. This can be seen by comparing the fifth line to the sixth line in FIG. 5. Thus, since the phase detector 31 does not vary its output voltage, neither does the VCO 33 vary its output frequency.

FIG. 6 is a timing diagram which shows how the AND gate 45 avoids a premature raising of the external clock signal to the phase detector 31. In this timing diagram, again following the sequence of events reviewed above, there would be a timing problem if the output from the delayed source mux 43 were fed directly to the phase detector 31 external input. The problem could occur while the load device 41 is waiting for the second clock signal to go low to thus allow it to raise the load signal. During this period, the delayed source mux 43 is still outputting the first clock signal because the flip-flop 44 has not yet transmitted the select signal to it since the load signal has not yet gone high again. Thus, if the delayed source mux 43, still outputting the first clock signal, were connected directly to the phase detector 31 and the first clock signal goes high (reference 11 in the first line) before the second clock signal goes low (reference 12 in the second line), the phase detector 31 would see its external signal (still synchronous with the first clock signal) go high (reference 13 in the sixth line) while the input from the divider 34 is still low (reference 14 in the fifth line). This phase difference would cause the phase detector 31 to alter its output signal which would cause the VCO 33 to output a change in frequency which would cause timing errors in the system.

FIG. 7 shows a logic diagram of the source multiplexor 42, comprising 3 AND gates, an inverter, and an OR gate, and its interconnections, along with the select signal and two clock signals as inputs, and its enable source load device output signal. FIG. 8 shows a logic diagram of the delayed source multiplexor 43, also comprising 3 AND gates, an inverter, and an OR gate, and its interconnections. FIG. 8 also shows the flip-flop 44 which inputs the select signal to the delayed source mux 43 when the load signal has returned to its high state and the AND gate 45 which logically ANDs the output clock signal from the delayed source mux 43 with the load signal from the state machine 41.

An alternative embodiment of the present invention is used when the phase detector of the PLL frequency multiplier is reactive on the rising edge of its input signals or when the clock signal does not maintain a 50% duty cycle. In this alternative embodiment, the objective of maintaining a stable output signal is achieved by making the load device state machine reactive to a rising signal from the divider output. The load device, which in this embodiment outputs a normally low load signal, takes the load signal high when the divider output goes high. The high load signal is then fed through an inverter to the divider which thus loads and clears the divider. The output of the divider is also fed through an inverter which thus stays high while the divider is being loaded and cleared. Lastly, the AND gate which logically ANDed the load signal and the clock signal from the delayed source mux in the preferred embodiment is replaced with an OR gate in this alternative embodiment. The logical OR of the load signal and the clock signal is then fed to the input of the phase detector of the PLL frequency multiplier.

In the foregoing specification, the invention has been described with reference to a specific exemplary embodiment and alternative embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

What is claimed is:

1. A circuit for maintaining a stable output from a phase-locked loop frequency multiplier circuit, comprising a phase detector, a voltage controlled oscillator, and a divider, when switching an input to said phase-locked loop frequency multiplier circuit from a first input signal to a second input signal, comprising:

(a) a load circuit coupled to receive as a first input an output of said divider of said phase-locked loop frequency multiplier circuit, said load circuit changing its output load signal from a first type of state to a second type of state when said second input signal is selected and the output of said divider changes from said first type of state to said second type of state, said divider of said phase-locked loop frequency multiplier circuit coupled to receive said load signal, said divider cleared when said load signal is in said second type of state;
    (b) a first switch coupled to receive said first input signal and said second input signal, said first switch for switching its output from said first input signal to said second input signal when said second input signal is selected, said load circuit coupled to receive as a second input said first switch output signal, said load circuit changing said load signal from said second type of state to said first type of state when said second input signal is selected and said first switch output signal changes from said first type of state to said second type of state, said load signal in said first type of state causing said divider of said phase-locked loop frequency multiplier circuit to continue counting;
    (c) a second switch coupled to receive said first input signal, said second input signal, and said load signal, said second switch for switching its output from said first input signal to said second input signal when said second input signal is selected and said load signal changes from said second type of state to said first type of state;
    (d) a logic circuit coupled to receive said load signal and said second switch output signal, said logic circuit for generating the logical AND of said load signal and said second switch output signal, said logic circuit output coupled to the input of said phase-locked loop frequency multiplier circuit.

2. The circuit for maintaining a stable output from a phase-locked loop frequency multiplier of claim 1, wherein said first type of state is a high state and said second type of state is a low state.

3. A circuit for maintaining a stable output from a phase-locked loop frequency multiplier circuit, comprising an exclusive-OR circuit, a voltage controlled oscillator, and a divider, when switching an input to said phase-locked loop frequency multiplier circuit from a first input signal to a second input signal, comprising:

(a) a load circuit coupled to receive as a first input an output of said divider of said phase-locked loop frequency multiplier circuit, said load circuit changing its output load signal from a first type of state to a second type of state when said second input signal is selected and the output of said divider changes from said first type of state to said second type of state, said divider of said phase-locked loop frequency multiplier circuit coupled to receive said load signal, said divider cleared when said load signal is in said second type of state;
    (b) a first switch coupled to receive said first input signal and said second input signal, said first switch for switching its output from said first input signal to said second input signal when said second input signal is selected, said load circuit coupled to receive as a second input said first switch output signal, said load circuit changing said load signal from said second type of state to said first type of state when said second input signal is selected and said first switch output signal changes from said first type of state to said second type of state, said load signal in said first type of state causing said divider of said phase-locked loop frequency multiplier circuit to continue counting;
    (c) a second switch coupled to receive said first input signal, said second input signal, and said load signal, said second switch for switching its output from said first input signal to said second input signal when said second input signal is selected and said load signal changes from said second type of state to said first type of state;
    (d) a logic circuit coupled to receive said load signal and said second switch output signal, said logic circuit for generating the logical AND of said load signal and said second switch output signal, said logic circuit output coupled to the input of said phase-locked loop frequency multiplier circuit.

4. The circuit for maintaining a stable output from a phase-locked loop frequency multiplier of claim 3, wherein said first type of state is a high state and said second type of state is a low state.

5. A circuit for maintaining a stable output from a phase-locked loop frequency multiplier circuit, comprising a phase detector, a voltage controlled oscillator, and a divider, when switching an input to said phase-locked loop frequency multiplier circuit from a first input signal to a second input signal, comprising:

(a) a load circuit coupled to receive as a first input an output of said divider of said phase-locked loop frequency multiplier circuit, said load circuit changing its output load signal from a first type of state to a second type of state when said second input signal is selected and the output of said divider changes from said first type of state to said second type of state, said divider of said phase-locked loop frequency multiplier circuit coupled to receive said load signal, said divider cleared when said load signal is in said second type of state;
    (b) a first switch coupled to receive said first input signal and said second input signal, said first switch for switching its output from said first input signal to said second input signal when said second input signal is selected, said load circuit coupled to receive as a second input said first switch output signal, said load circuit changing said load signal from said second type of state to said first type of state when said second input signal is selected and said first switch output signal changes from said first type of state to said second type of state, said load signal in said first type of state causing said divider of said phase-locked loop frequency multiplier circuit to continue counting;

(c) a second switch coupled to receive said first input signal, said second input signal, and said load signal, said second switch for switching its output from said first input signal to said second input signal when said second input signal is selected and said load signal changes from said second type of state to said first type of state;

(d) a logic circuit coupled to receive said load signal and said second switch output signal, said logic circuit for generating the logical OR of said load signal and said second switch output signal, said logic circuit output coupled to the input of said phase-locked loop frequency multiplier circuit.

6. The circuit for maintaining a stable output from a phase-locked loop frequency multiplier of claim 5, wherein said first type of state is a low state and said second type of state is a high state.

7. A method of maintaining a stable output from a phase-locked loop frequency multiplier circuit, comprising a phase detector, a voltage controlled oscillator, and a divider, when switching an input to said phase-locked loop frequency multiplier circuit from a first input signal to a second input signal, comprising the steps of:

(a) continuously clearing the divider of said phase-locked loop frequency multiplier circuit when said first input signal changes from a first type of state to a second type of state;

(b) holding the input to said phase-locked loop frequency multiplier circuit in said second type of state;

(c) no longer clearing the divider of said phase-locked loop frequency multiplier circuit when said second input signal changes from said second type of state to said first type of state;

(d) switching the input to said phase-locked loop frequency multiplier circuit from said first input signal to said second input signal when said second input signal is in said second type of state and before the divider of said phase-locked loop frequency multiplier circuit has continued counting and outputted a change in type of state.

8. The method of maintaining a stable output from a phase-locked loop frequency multiplier of claim 7 wherein said first type of state is a high state and said second type of state is a low state.

9. The method of maintaining a stable output from a phase-locked loop frequency multiplier of claim 7, wherein said first type of state is a low state and said second type of state is a high state.

10. A method of maintaining a stable output from a phase-locked loop frequency multiplier circuit, comprising an exclusive-OR circuit, a voltage controlled oscillator, and a divider, when switching an input to said phase-locked loop frequency multiplier circuit from a first input signal to a second input signal, comprising the steps of:

(a) continuously clearing the divider of said phase-locked loop frequency multiplier circuit when said first input signal changes from a first type of state to a second type of state;

(b) holding the input to said phase-locked loop frequency multiplier circuit in said second type of state;

(c) no longer clearing the divider of said phase-locked loop frequency multiplier circuit when said second input signal changes from said second type of state to said first type of state;

(d) switching the input to said phase-locked loop frequency multiplier circuit from said first input signal to said second input signal when said second input signal is in said second type of state and before the divider of said phase-locked loop frequency multiplier circuit has continued counting and outputted a change in type of state.

* * * * *